United States Patent
Hsieh et al.

(10) Patent No.: US 11,205,710 B2
(45) Date of Patent: Dec. 21, 2021

(54) FABRICATING METHOD OF SEMICONDUCTOR STRUCTURE

(71) Applicant: UNITED MICROELECTRONICS CORP., Hsin-Chu (TW)

(72) Inventors: Wen-Chien Hsieh, Tainan (TW);
En-Chiuan Liou, Tainan (TW);
Chih-Wei Yang, Tainan (TW);
Yu-Cheng Tung, Kaohsiung (TW);
Po-Wen Su, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 11 days.

(21) Appl. No.: 16/357,333

(22) Filed: Mar. 19, 2019

(65) Prior Publication Data

US 2019/0214480 A1 Jul. 11, 2019

Related U.S. Application Data

(62) Division of application No. 15/252,200, filed on Aug. 30, 2016, now Pat. No. 10,283,616.

(51) Int. Cl.
*H01L 29/66* (2006.01)
*H01L 27/088* (2006.01)
(Continued)

(52) U.S. Cl.
CPC ...... *H01L 29/66545* (2013.01); *H01L 21/266* (2013.01); *H01L 21/26513* (2013.01); *H01L 21/823431* (2013.01); *H01L 21/823437* (2013.01); *H01L 27/0886* (2013.01); *H01L 29/66795* (2013.01); *H01L 29/7851* (2013.01); *H01L 29/7853* (2013.01)

(58) Field of Classification Search
CPC . H01L 29/785–7856; H01L 29/66795–66818; H01L 29/66545; H01L 29/66871; H01L 29/66606; H01L 2029/7857–7858; H01L 27/0886; H01L 21/823431; H01L 21/823821
See application file for complete search history.

(56) References Cited

U.S. PATENT DOCUMENTS

| 8,404,535 B2 | 3/2013 | Yu | |
| 2003/0099766 A1 * | 5/2003 | Jurczak | H01L 21/32155 427/58 |

(Continued)

*Primary Examiner* — Lauren R Bell
(74) *Attorney, Agent, or Firm* — Winston Hsu

(57) ABSTRACT

A fabricating method of a semiconductor structure includes the following steps. A gate material layer is formed on a semiconductor substrate. A patterned mask layer is formed on the gate material layer. The pattern mask layer includes at least one opening exposing a part of the gate material layer. An impurity treatment is performed to the gate material layer partially covered by the pattern mask layer for forming at least one doped region in the gate material layer. An etching process is performed to remove the gate material layer including the doped region. A dummy gate may be formed by patterning the gate material layer, and the impurity treatment may be performed after the step of forming the dummy gate. The performance of the etching processes for removing the gate material layer and/or the dummy gate may be enhanced, and the gate material residue issue may be solved accordingly.

7 Claims, 11 Drawing Sheets

(51) Int. Cl.
*H01L 21/8234* (2006.01)
*H01L 21/265* (2006.01)
*H01L 21/266* (2006.01)
*H01L 29/78* (2006.01)

(56) References Cited

U.S. PATENT DOCUMENTS

| | | | |
|---|---|---|---|
| 2005/0106890 A1* | 5/2005 | Schroeder | H01L 21/0274 |
| | | | 438/719 |
| 2013/0113027 A1 | 5/2013 | Chiang | |
| 2013/0164924 A1* | 6/2013 | Shieh | H01L 29/7855 |
| | | | 438/586 |
| 2013/0203247 A1 | 8/2013 | Hsieh | |
| 2014/0213048 A1* | 7/2014 | Sun | H01L 29/1054 |
| | | | 438/592 |
| 2014/0287565 A1 | 9/2014 | Yin | |
| 2014/0315365 A1 | 10/2014 | Chen | |
| 2016/0336320 A1* | 11/2016 | Lin | H01L 29/495 |
| 2017/0125411 A1* | 5/2017 | Yu | H01L 29/66545 |

* cited by examiner

FABRICATING METHOD OF SEMICONDUCTOR STRUCTURE

CROSS REFERENCE TO RELATED APPLICATIONS

This application is a division of application Ser. No. 15/252,200 filed on Aug. 30, 2016, now allowed, which is incorporated by reference herein in its entirety.

BACKGROUND OF THE INVENTION

1. Field of the Invention

The present invention relates to a fabricating method of a semiconductor structure, and more particularly, to a fabricating method of a semiconductor structure for solving a gate material residue issue.

2. Description of the Prior Art

In the continuously improved semiconductor integrated circuit technology, the sizes of the semiconductor devices become smaller for increasing the integrity of the integrated circuit. In the scaling down process, the thickness control of layers in the semiconductor device becomes more and more critical. To increase the performance of transistors, metal gates are commonly used in semiconductors to replace the traditional polysilicon gates as control electrodes. Two metal gate processing approaches are mainly performed: a gate first process or a gate last process. The gate last process tends to replace the gate first process, since it allows a greater choice of materials for the high-k gate dielectric layer and the metal gate.

The replacement metal gate (RMG) process is a kind of the gate last process commonly used in the related industries. In the RMG process, dummy gates have to be removed before the step of forming metal gates. Amorphous silicon is generally used as a material for the dummy gates, and at least a part of the amorphous silicon may be transformed to polysilicon by thermal processes performed after the step of forming the dummy gates and before the step of removing the dummy gates. However, it is difficult to control the condition of etching the polysilicon dummy gates when the crystal orientations of polysilicon grains in the dummy gate are non-uniform and/or uncertain. Therefore, the issue of polysilicon residue may be serious after the step of removing the dummy gates, and the manufacturing yield and the device performance may be affected accordingly.

SUMMARY OF THE INVENTION

It is one of the objectives of the present invention to provide a fabricating method of a semiconductor structure. An impurity treatment is performed to a gate material layer partially covered by a pattern mask layer for forming at least one doped region in the gate material layer before an etching process for removing the gate material layer. Additionally, an impurity treatment may be performed to a dummy gate partially covered by a pattern mask layer for forming at least one treated region in the dummy gate before an etching process for removing the dummy gate. The dummy gate may be formed by patterning the gate material layer. In other words, the impurity treatment may be performed before the step of forming the dummy gate or after the step of forming the dummy gate for solving the gate material residue issue after the step of removing the gate material layer and the dummy gate.

According to an embodiment of the present invention, a fabricating method of a semiconductor structure is provided. The fabricating method includes the following steps. A gate material layer is formed on a semiconductor substrate. A patterned mask layer is formed on the gate material layer. The pattern mask layer includes at least one opening exposing a part of the gate material layer. An impurity treatment is performed to the gate material layer partially covered by the pattern mask layer for forming at least one doped region in the gate material layer. An etching process is performed to remove the gate material layer including the doped region.

According to another embodiment of the present invention, a fabricating method of a semiconductor structure is provided. The fabricating method includes the following steps. At least one dummy gate is formed on a semiconductor substrate. A spacer is formed on a sidewall of the dummy gate. A patterned mask layer is formed on the dummy gate. The pattern mask layer includes at least one opening exposing a part of the dummy gate. An impurity treatment is performed to the dummy gate partially covered by the pattern mask layer for forming at least one treated region in the dummy gate. An etching process is performed to remove the dummy gate including the treated region for forming a trench surrounded by the spacer.

In the fabricating method of the semiconductor structure according to the present invention, the impurity treatment is performed for forming the doped region in the gate material layer or forming the treated region in the dummy gate. The crystallization of the gate material layer may be influenced by the impurity treatment, and some of the crystal orientations in the dummy gate may be destroyed by the impurity treatment. The performance of the etching processes for removing the gate material layer and/or the dummy gate may be enhanced, and the gate material residue issue may be solved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a fabricating method of a semiconductor structure according to a first embodiment of the present invention, wherein FIG. 2 is a cross-sectional diagram taken along a line A-A' in FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-10 are schematic drawings illustrating a fabricating method of a semiconductor structure according to a second embodiment of the present invention, wherein FIG. 7 is a cross-sectional diagram taken along a line B-B' in FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
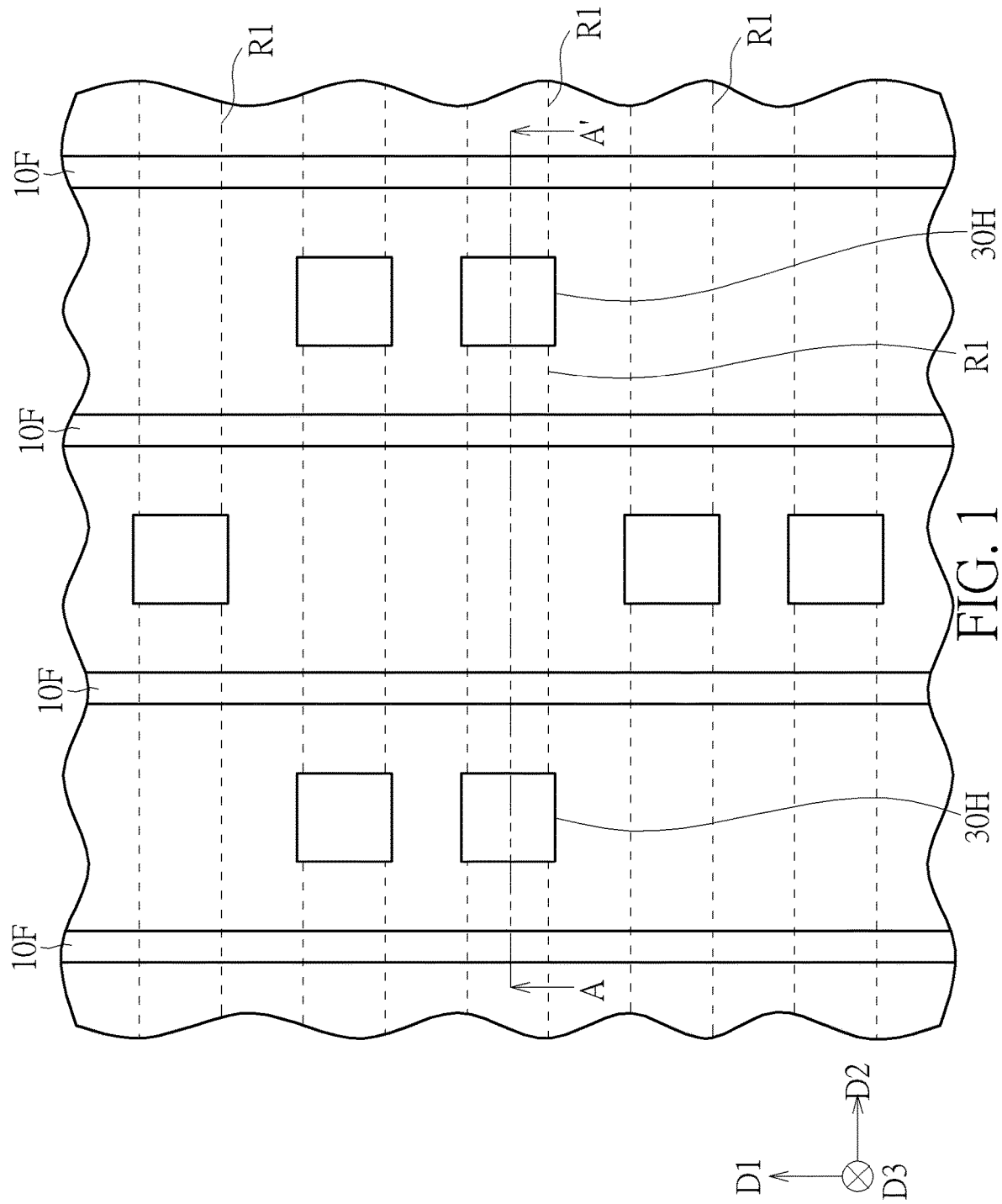
Figure 2:
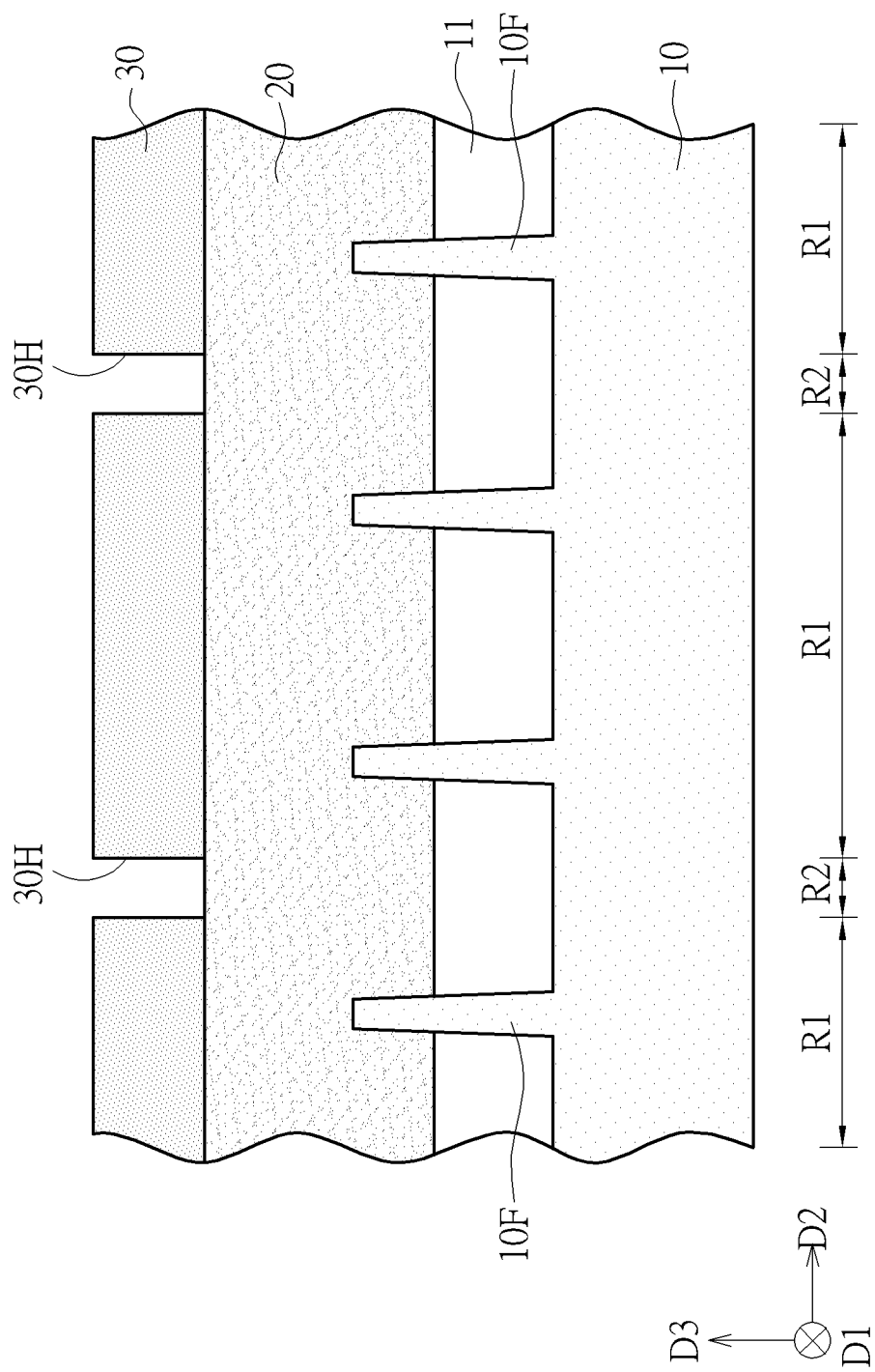

Please refer to FIGS. 1-5. FIGS. 1-5 are schematic drawings illustrating a fabricating method of a semiconductor structure according to a first embodiment of the present invention. FIG. 1 is a top-view diagram. FIGS. 2-5 are cross-sectional diagrams, and FIG. 2 is a cross-sectional diagram taken along a line A-A' in FIG. 1. The fabricating method of the semiconductor structure in this embodiment includes the following steps. As shown in FIG. 1 and FIG. 2, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 includes at least one fin structure 10F, and the fin structure 10F includes a fin-shaped structure made of semiconductor material. In this embodiment, the semiconductor substrate 10 may include a plurality of the fin structures 10F. Each of the fin structures 10F may be elongated in a first direction D1, and the fin structures 10F are repeatedly disposed in a second direction D2. The first direction D1 may be substantially orthogonal to the second direction D2, but not limited thereto. The fin structures 10F may be formed by performing a patterning process, such as a multiple patterning process, to the semiconductor substrate 10. The fin structures 10F may be separated from one another by a shallow trench isolation (STI) structure 11. A top surface of the shallow trench isolation structure 11 is lower than a top surface of the fin structure 10F in a vertical direction D3 for exposing a part of each of the fin structures 10F.

A gate material layer 20 is formed on the semiconductor substrate 10. The gate material layer 20 may cover the fin structures 10F and the shallow trench isolation structure 11. The gate material layer 20 may be used to form dummy gates (not shown in FIG. 1 and FIG. 2) in subsequent processes. Therefore, there may be a plurality of predetermined regions R1 in the gate material layer 20 for forming the dummy gates. The gate material layer 20 may include amorphous silicon or other suitable conductive materials, dielectric materials, or semiconductor materials. A patterned mask layer 30 is then formed on the gate material layer 20. The pattern mask layer 30 includes at least one opening 30H exposing a part of the gate material layer 20. The patterned mask layer 30 may be composed of a single layer or multiple layers of dielectric materials, such as silicon oxide, or silicon nitride, or other suitable materials. In some embodiments, the pattern mask layer 30 may include a plurality of the openings 30H, and each of the openings 30H may overlap a region R2 in the gate material layer 20 located between two adjacent predetermined regions R1 in the second direction D2, but not limited thereto. In some embodiments of the present invention, each of the openings 30H may be elongated in the first direction D1 for overlapping a plurality of the regions R2. For keeping the fin structures 10F from being influenced by the subsequent impurity treatment, each of the openings 30H does not overlap the fin structures 10F along the second direction D2. Additionally, each of the openings 30H may not overlap the predetermined regions R1 along the second direction D2 preferably, but not limited thereto.

Figure 3:
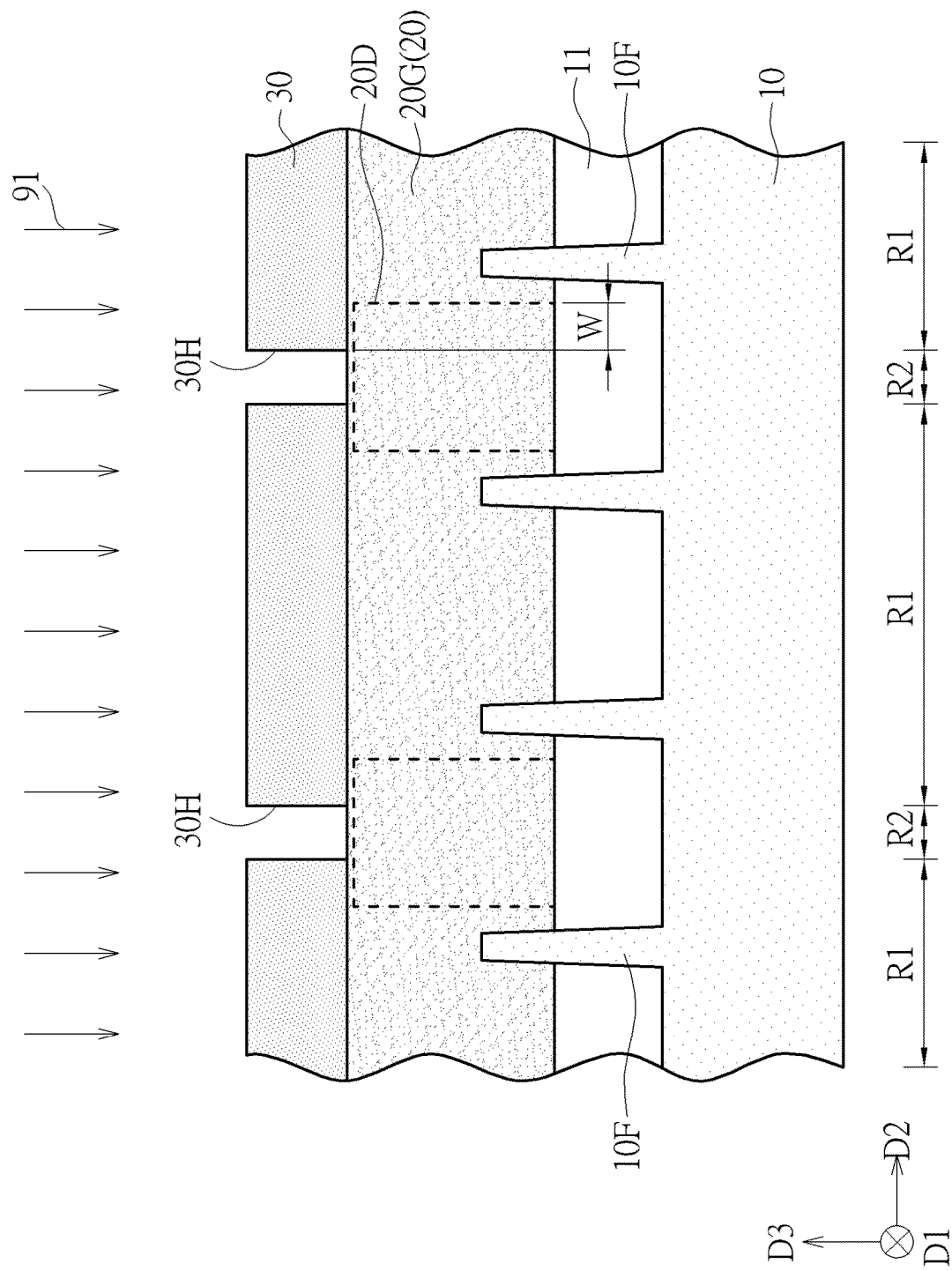

As shown in FIG. 3, an impurity treatment 91 is then performed to the gate material layer 20 partially covered by the pattern mask layer 30 for forming at least one doped region 20D in the gate material layer 20. In some embodiments, a plurality of the doped regions 20D may be formed in the gate material layer 20, and each of the doped regions 20D is formed corresponding to one of the openings 30H in the patterned mask layer 30 in the vertical direction D3. The impurity treatment 91 may include an ion implantation process or other suitable processes. A dopant used in the impurity treatment 91 may include an n-type dopant, such as arsenic (As) and phosphorus (P), or other suitable dopants, such as germanium and carbon, but not limited thereto. Therefore, the doped region 20D in the gate material layer 20 may include an n-type doped region or other kinds of doped regions. It is worth noting that, the dopants in the gate material layer 20 may diffuse laterally to form the doped region 20D, and an area of the doped region 20D in the second direction D2 will be larger than the corresponding opening 30H in the patterned mask layer 30. In other words, each of the doped regions 20D may be composed of one of the regions R2 and a part of two predetermined regions R1 adjacent to the region R2. The area of the doped region 20D may be controlled by the process conditions of the impurity treatment 91 and/or an anneal process performed subsequently. In some embodiments, the impurity treatment 91 may include a tilted implantation process for forming the doped region 20D, but bot limited thereto. A distant W between the border of the doped region 20D and the opening 30H in the second direction D2 may be shorter than or equal to a distant between the opening 30H and the fin structure 10F adjacent to the opening 30H in the second direction D2, but not limited thereto.

Figure 4:
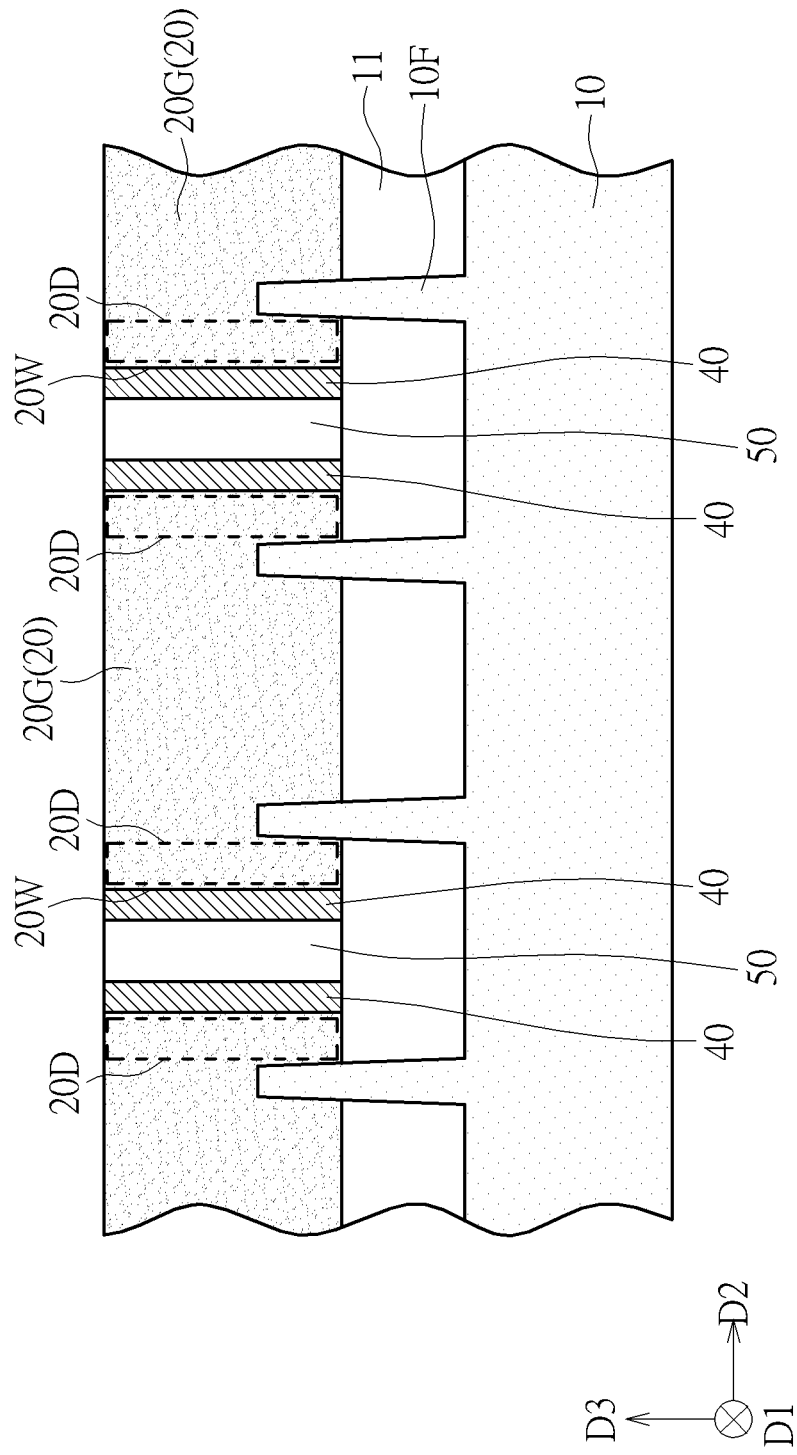

As shown in FIG. 3 and FIG. 4, after the impurity treatment 91, the gate material layer 20 is patterned for forming a plurality of dummy gates 20G, and at least one of the dummy gates 20G includes the doped region 20G of the gate material layer 20. For example, the gate material layer 20 in the predetermined regions R1 is remained for forming the dummy gates 20G in the predetermined regions R1, and the gate material layer 20 in other regions, such as the regions R2, is removed by the patterning process. Each of the dummy gates 20G is formed straddling at least one of the fin structures 10F, and each of the dummy gates 20G may be elongated in the second direction D2, but not limited thereto. At least of a part of the doped region 20D in the dummy gate 20G may be located between a sidewall 20W of the dummy gate 20G and the fin structure 10F straddled by the dummy gate 20G. For example, as shown in FIG. 4, one of the dummy gates 20G may be formed straddling two of the fin structures 10F, one of the doped regions 20D may be located between the sidewall 20W at the right side of the dummy gate 20G and the fin structure 10F closer to the right side of the dummy gate 20G, and another one of the doped regions 20D may be located between the sidewall 20W at the left side of the dummy gate 20G and the fin structure 10F closer to the left side of the dummy gate 20G.

In addition, a plurality of spacers 40 may be formed on the sidewalls 20W of the dummy gates 20G, and a dielectric layer 50 may be formed between the spacers 40. The method of forming the spacers 40 may include but is not limited to the following steps. For example, a spacer material layer may be formed conformally on the surfaces of the dummy gates 20G and the STI structure 11 first, and an anisotropic etching process may then be performed to remove a part of the spacer material layer for forming the spacers 40 on the sidewalls 20W of the dummy gates 20G. The material of the spacers may include oxide, nitride, oxynitride, or other suitable insulation materials, and each of the spacers 40 may be composed of a single spacer material layer or multiple spacer material layers. The dielectric layer 50 may include oxide, nitride, oxynitride, or other suitable dielectric materials. Additionally, a plurality of source/drain regions (not shown) may be formed in the fin structures 10F after the step of forming the spacers 40 and before the step of forming the dielectric layer 50. A part of the dielectric layer 50 may be formed on the dummy gates 20G, and a planarization process, such as a chemical mechanical polishing (CMP) process, may be performed to remove a part of the dielectric layer 50 for exposing the top surfaces of the dummy gates 20G.

Figure 5:
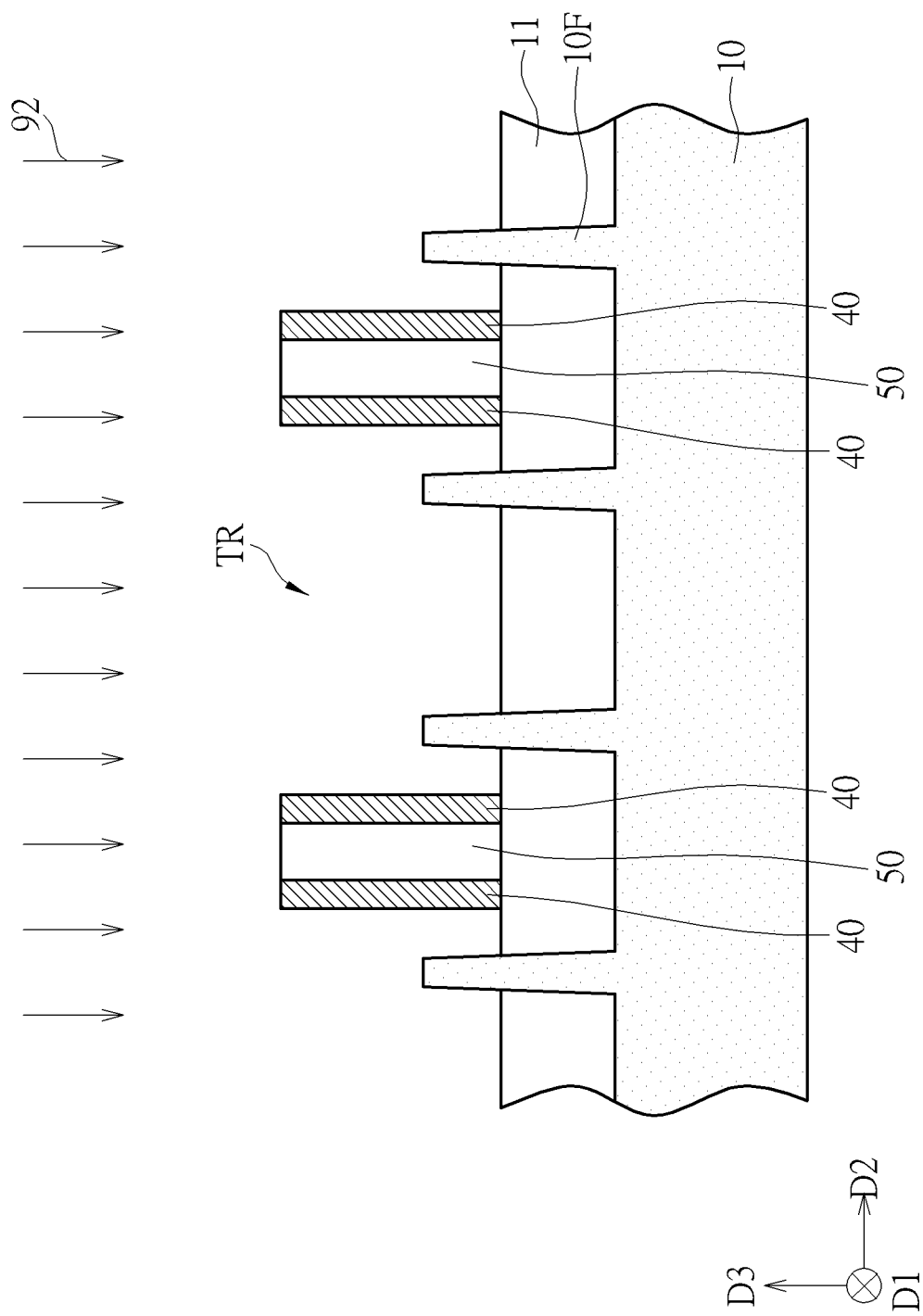

As shown in FIG. 4 and FIG. 5, an etching process 92 is performed to remove the gate material layer 20, and the gate material layer 20 includes the doped regions 20D. In other words, the dummy gates 20G are removed by the etching process 92. The etching process 92 may include a wet etching process, and an etchant used in the wet etching process may include ammonium hydroxide ($NH_4OH$) or other suitable chemical components, but the present invention is not limited to this. Other appropriate etching processes, such as dry etching, are within the contemplated scope of the present invention. In other words, the etching process 92 is performed after the steps of forming the dummy gates 20G and the spacers 40. The gate material layer 20 including the doped regions 20D is completely removed by the etching process 92, and the dummy gates 20G are completely removed by the etching process 92 preferably. A trench TR is formed and surrounded by the spacer 40 after the dummy gate 20G including the doped regions 20D is removed by the etching process 92, and a metal gate structure (not shown) may be formed in the trench TR. In other words, the semiconductor structure shown in FIG. 5 may be a structure in a replacement metal gate (RMG) process before the step of forming the metal gate structure. The metal gate structure may include a high dielectric constant (high-k) dielectric layer, a work function layer, and a metal electrode, but not limited thereto. Therefore, the fabricating method of the semiconductor structure in this embodiment may be integrated with a high-k last process for keeping the high-k dielectric layer from being affected by the impurity treatment described above, but not limited thereto. In some embodiments of the present invention, the fabricating method of the semiconductor structure may still be integrated with a high-k first process, and the high-k dielectric layer may be formed before the step of forming the gate material layer 20.

In the fabricating method of the semiconductor structure in this embodiment, the gate material layer 20 may be crystallized by other thermal processes before the etching process 92, and the impurity treatment may be used to influence the crystallization of the gate material layer 20 for enhancing the performance of the etching process 92 and solving the gate material residue issue after the etching process 92. For example, when the gate material layer 20 is amorphous silicon, the amorphous silicon may be transformed to polysilicon by the thermal process performed before the etching process 92. It is difficult to control the condition of the etching process 92 when the crystal orientations of polysilicon grains in the dummy gates 20G are non-uniform and/or uncertain. For instance, there may be crystal plane {111}, {110}, or {100} of polysilicon grains in the dummy gates 20G, and the etching rates of these crystal orientations differ significantly. Generally, the etching rate of crystal plane {111} is the slowest, and the etching time of the etching process 92 has to become longer for completely removing the dummy gates 20G or there might be a part of the gate material layer 20 remaining on the semiconductor substrate 10 after the etching process 92. However, the dopants implanted into the gate material layer 20 may be used to occupy some lattice spacer in the gate material layer 20 and it is unfavorable for forming crystal plane {111} in the doped regions 20D. Therefore, the issue of polysilicon residue may be solved, and the manufacturing yield may be improved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
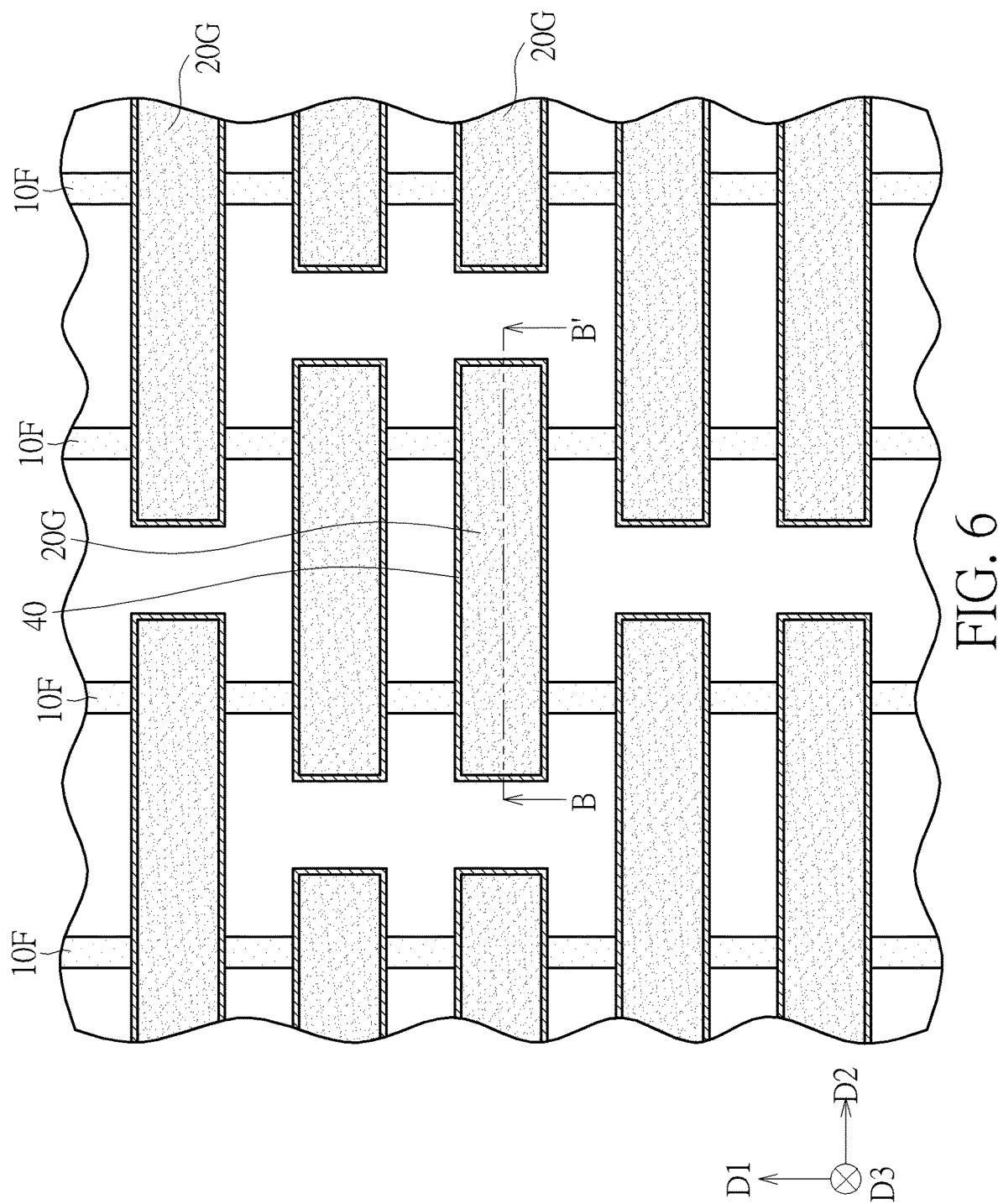
Figure 7:
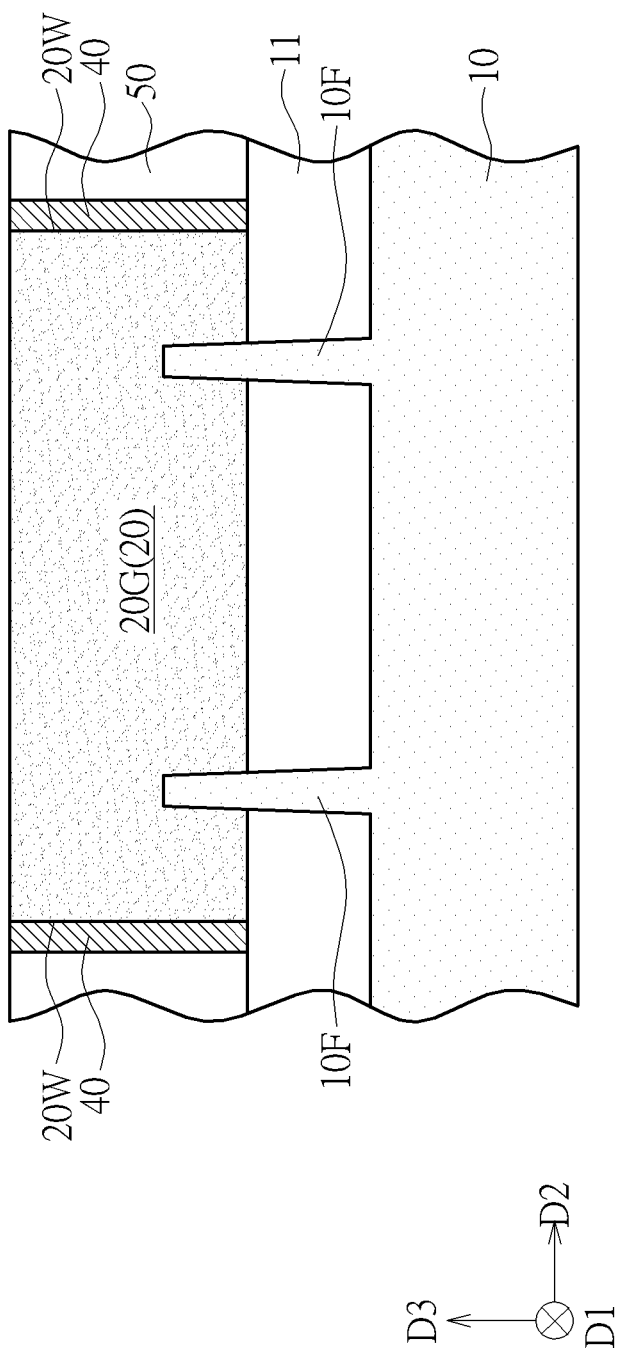

Please refer to FIGS. 6-10. FIGS. 6-10 are schematic drawings illustrating a fabricating method of a semiconductor structure according to a second embodiment of the present invention. FIG. 6 is a top-view diagram. FIGS. 7-10 are cross-sectional diagrams, and FIG. 7 is a cross-sectional diagram taken along a line B-B' in FIG. 6. The fabricating method of the semiconductor structure in this embodiment includes the following steps. As shown in FIG. 6 and FIG. 7, at least one dummy gate 20G is formed on the semiconductor substrate 10, and the spacer 40 is formed on the sidewall 20W of the dummy gate 20G. The semiconductor substrate 10 includes a plurality of the fin structures 10F, and the dummy gate 20G is formed straddling at least one of the fin structures 10F. For example, the dummy gate 20G may be formed straddling two of the fin structures 10F adjacent to each other in the second direction D2, but not limited thereto. A plurality of source/drain regions (not shown) may be formed in the fin structures 10F after the step of forming the spacers 40 and before the step of forming the dielectric layer 50. A part of the dielectric layer 50 may be formed on the dummy gates 20G, and a planarization process, such as a chemical mechanical polishing (CMP) process, may be performed to remove a part of the dielectric layer 50 for exposing the top surfaces of the dummy gates 20G.

Figure 8:
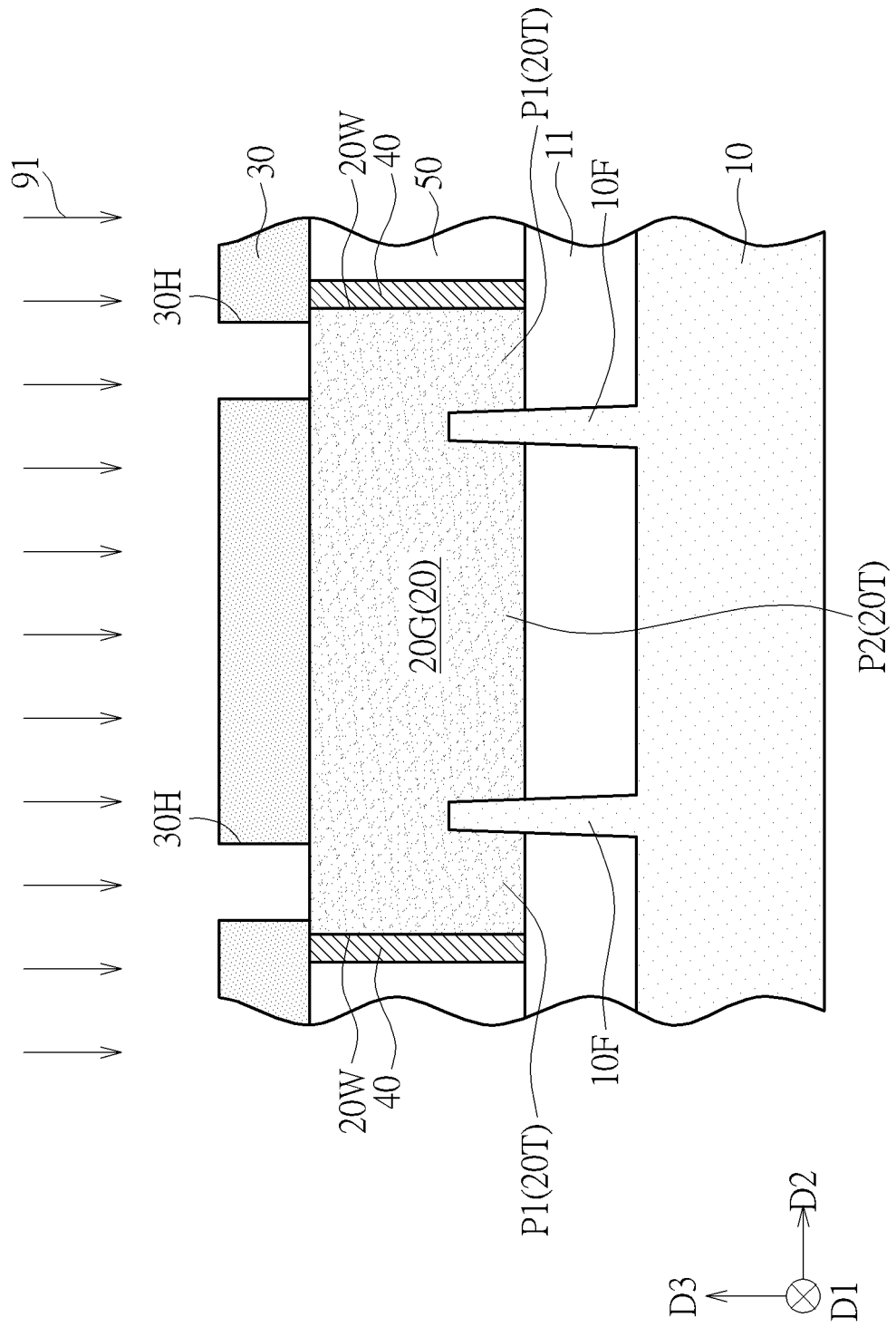

As shown in FIG. 8, the patterned mask layer 30 is formed on the dummy gate 20G, and the pattern mask layer 30 includes at least one opening 30H exposing a part of the dummy gate 20G. In other words, the patterned mask layer 30 in this embodiment is formed after the step of forming the dummy gates 20G, and the patterned mask layer 30 in the first embodiment mentioned above is formed before the step of forming the dummy gates 20G. Subsequently, an impurity treatment 91 is performed to the dummy gate 20G partially covered by the pattern mask layer 30 for forming at least one treated region 20T in the dummy gate 20G. For example, the patterned mask layer 30 may include a plurality of the openings 30H for forming a plurality of the treated regions 20T in the dummy gate 20G, but not limited thereto. For keeping the fin structures 10F from being influenced by the impurity treatment 91, each of the openings 30H does not overlap the fin structures 10F along the second direction D2 preferably, but not limited thereto. In some embodiments, the openings 30H may overlap two opposite ends of the dummy gate 20G in the second direction D2, and at least a part of each of the treated regions 20T in the dummy gate 20G (such as a first part P1 shown in FIG. 8) is located between the sidewall 20W of the dummy gate 20G and the fin structure 10F straddled by the dummy gate 20G. For example, at least one of the dummy gates 20G may be formed straddling two of the fin structures 10F adjacent in the second direction D2, one of the treated regions 20T may be located between the sidewall 20W at the right side of the dummy gate 20G and the fin structure 10F closer to the right side of the dummy gate 20G, and another one of the treated regions 20T may be located between the sidewall 20W at the left side of the dummy gate 20G and the fin structure 10F closer to the left side of the dummy gate 20G. In some embodiments, the openings 30H may overlap at least a part of the spacers 40 for ensuring that the treated regions 20T may be formed at the ends of the dummy gate 20G in the second direction D2, but not limited thereto.

In some embodiments, the dummy gate 20G may include a polysilicon dummy gate, and the dopant used in the impurity treatment 91 may include an n-type dopant, such as a an arsenic dopant, or a germanium dopant for destroying a crystal structure, such as a crystal structure having crystal plane {111}, in the dummy gate 20G, but the present invention is not limited to this. Other appropriate dopants for improving the etching performance of the etching process performed subsequently are within the contemplated scope of the present invention. For example, the dopant used in the impurity treatment 91 may include a chlorine base dopant, or other dopants for enhancing the etching rate of the etching process for removing the dummy gate 20G.

Figure 9:
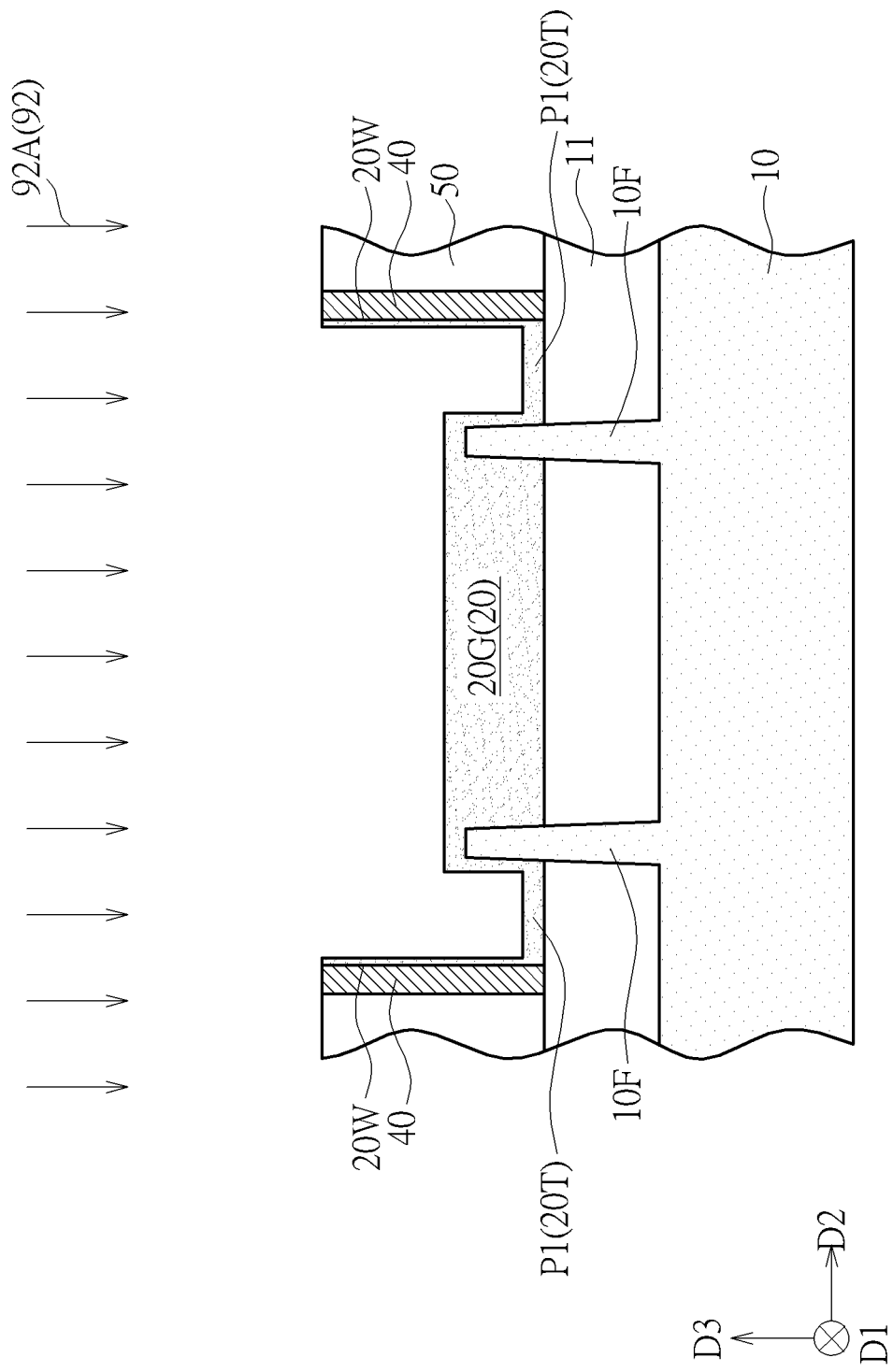
Figure 10:
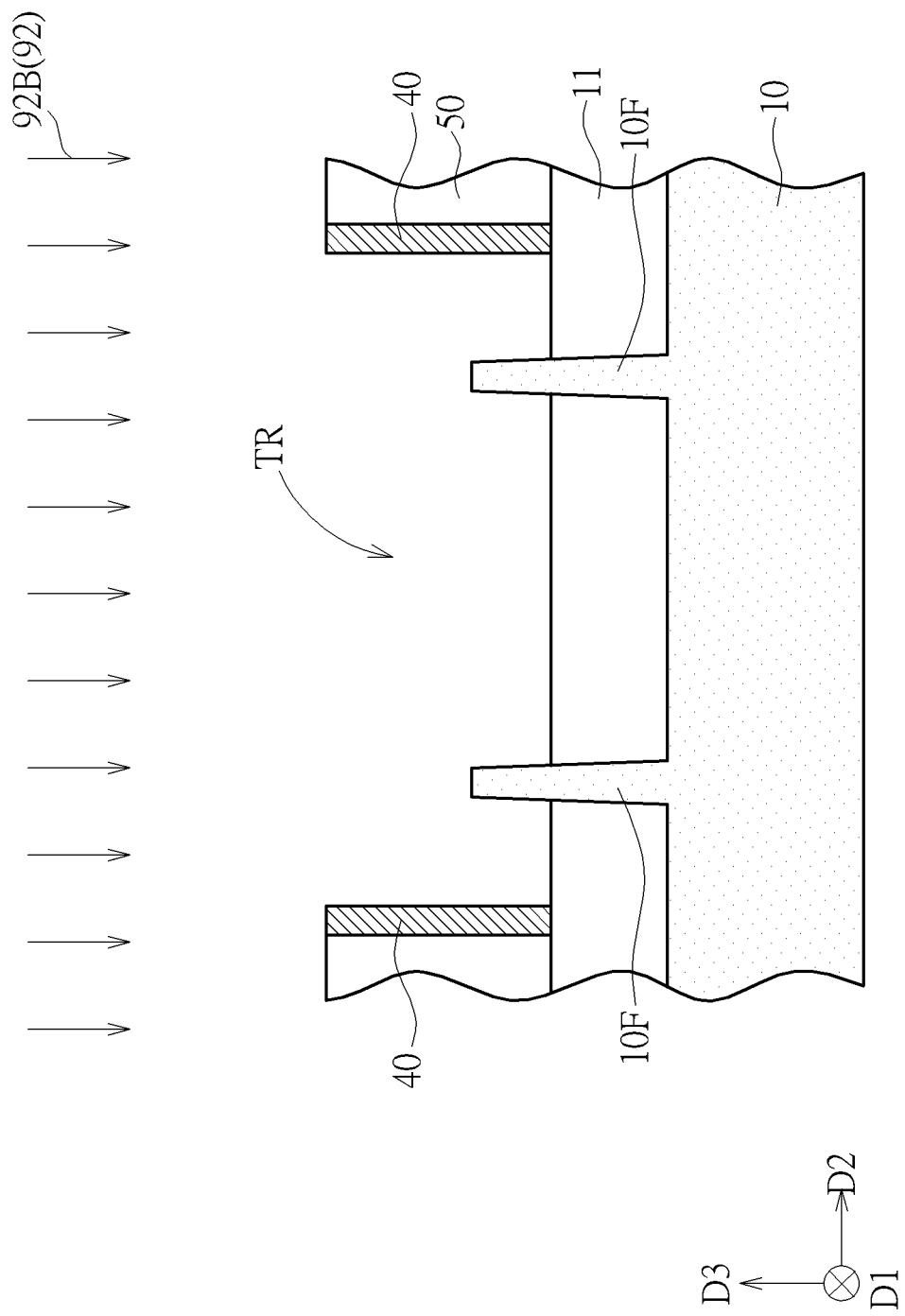

As shown in FIG. 9 and FIG. 10, an etching process 92 is performed to remove the dummy gate 20G including the treated regions 20T for forming a trench TR surrounded by the spacer 40. In some embodiments, the etching process 92 may include a plurality of etching steps, such as a dry etching step 92A and a wet etching step 92B. The dry etching step 92A is performed before the wet etching steps 92B. As shown in FIG. 9, the dummy gate 20G including the treated regions 20T is partially removed by the dry etching step 92A. An etching rate of the treated regions 20T in the dummy gate 20G is higher than an etching rate of other regions in the dummy gate 20T during the etching process, such as the dry etching step 92A, but not limited thereto. As shown in FIG. 9 and FIG. 10, the wet etching step 92B is performed after the dry etching step 92A, and the dummy gate 20G is completely removed by the wet etching step 92B. By employing the dry etching step 92A and the wet etching step 92B mentioned above, the etching performance of the etching process 92 may be enhanced, and the influence of the dry etching step 92A on the fin structures 10F may be avoided accordingly. As shown in FIG. 9 and FIG. 10, the dummy gate 20G including the treated region 20T is completely removed by the etching process 92. Additionally, in some embodiments, the etching process 92 may be a single etching step, such as a wet etching step only, for removing the dummy gate 20G completely.

The impurity treatment in this embodiment may be used to destroy a crystal structure, such as a crystal structure having crystal plane {111}, in the dummy gate 20G for enhancing the performance of the etching process 92. The issue of dummy gate residue may be solved, and the manufacturing yield may be improved accordingly. It is worth noting that, in some embodiments, the impurity treatment described above may be performed before the step of forming the dummy gate 20G and/or after the step of forming the dummy gate 20G. In other words, the impurity treatment may be performed twice or more for ensuring that there is no gate material residue after the etching process 92.

Figure 11:
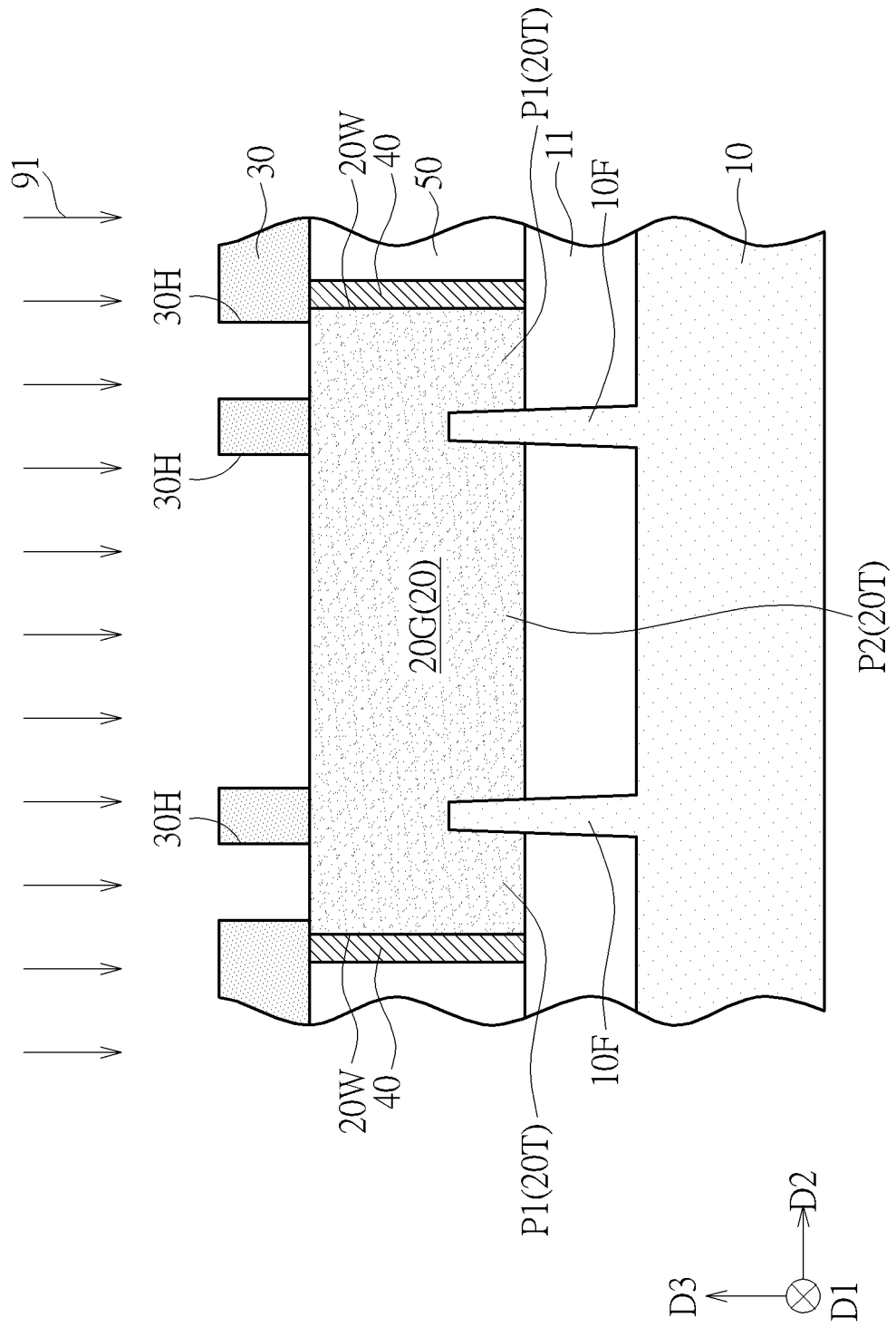
FIG. 11 is a schematic drawing illustrating a fabricating method of a semiconductor structure according to a third embodiment of the present invention.

Please refer to FIG. 11. FIG. 11 is a schematic drawing illustrating a fabricating method of a semiconductor structure according to a third embodiment of the present invention. As shown in FIG. 11, the difference between the fabricating method in this embodiment and the fabricating method in the second embodiment mentioned above is that one of the openings 30H in the patterned mask layer 30 is formed corresponding to an area in the dummy gate 20G between two adjacent fin structures 10F in the second direction D2. Therefore, at least apart of the treated region 20T (such as a second part P1 shown in FIG. 11) is formed between the two adjacent fin structures 10F straddled by the dummy gate 20G by the impurity treatment 91 for further reducing gate material residue between the two adjacent fin structures 10F after the etching process for removing the dummy gate 20G.

To summarize the above descriptions, in the fabricating method of the semiconductor structure according to the present invention, the impurity treatment may be performed before the step of forming the dummy gate or after the step of forming the dummy gate for solving the gate material residue issue after the etching process of removing the gate material layer and the dummy gate. The crystallization of the gate material layer may be influenced by the impurity treatment, and some of the crystal orientations in the dummy gate may be destroyed by the impurity treatment. The performance of the etching processes for removing the gate material layer and/or the dummy gate may be enhanced, and the gate material residue issue may be solved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a semiconductor structure, comprising:
   forming a dummy gate on a semiconductor substrate, wherein the semiconductor substrate comprises a first fin structure, and the dummy gate is formed straddling the first fin structure, wherein the first fin structure is elongated in a first direction, and the dummy gate is elongated in a second direction orthogonal to the first direction;
   forming a spacer on a sidewall of the dummy gate;
   forming a patterned mask layer on the dummy gate, wherein the patterned mask layer comprises an opening exposing a first part of the dummy gate, and the patterned mask layer covers a second part of the dummy gate, wherein the opening of the patterned mask layer does not overlap the first fin structure in a vertical direction orthogonal to the first direction and the second direction, and a part of the patterned mask layer overlaps the first fin structure in the vertical direction;
   performing an impurity treatment to the dummy gate partially covered by the patterned mask layer for forming a treated region in the dummy gate, wherein the treated region is located at an end of the dummy gate in the second direction and at least a part of the treated region in the dummy gate is located between the spacer and the first fin structure in the second direction; and
   performing an etching process to remove the dummy gate and the treated region for forming a trench surrounded by the spacer, wherein the etching process comprises:
      a dry etching step, wherein the dummy gate and the treated region are partially removed by the dry etching step, the opening of the patterned mask layer overlaps a part of the semiconductor substrate in the vertical direction, and the part of the semiconductor substrate is covered by a remaining part of the treated region after the dry etching step; and
      a wet etching step performed after the dry etching step, wherein a remaining part of the dummy gate after the dry etching step is completely removed by the wet etching step, and the remaining part of the treated region after the dry etching step is completely removed by the wet etching step.

2. The fabricating method of claim 1, wherein the semiconductor substrate further comprises a second fin structure adjacent to the first fin structure, the dummy gate is formed straddling the first fin structure and the second fin structure, and at least a part of the treated region is located between the first fin structure and the second fin structure.

3. The fabricating method of claim 1, wherein a dopant used in the impurity treatment comprises a chlorine base dopant, and an etching rate of the treated region in the dummy gate is higher than an etching rate of other regions in the dummy gate during the etching process.

4. The fabricating method of claim 1, wherein a dopant used in the impurity treatment comprises a germanium dopant or an arsenic dopant for destroying a crystal structure in the dummy gate.

5. The fabricating method of claim 1, wherein the dummy gate comprises a polysilicon dummy gate.

6. The fabricating method of claim 1, wherein an etching rate of the treated region in the dummy gate is higher than an etching rate of other regions in the dummy gate during the dry etching step.

7. The fabricating method of claim 1, wherein the dummy gate and the treated region are completely removed by the etching process.

\* \* \* \* \*